United States Patent
Buechel et al.

(10) Patent No.: US 6,586,764 B2
(45) Date of Patent: Jul. 1, 2003

(54) LED COMPRISING A CONDUCTIVE TRANSPARENT POLYMER LAYER WITH LOW SULFATE AND HIGH METAL ION CONTENT

(75) Inventors: Michael Buechel, Eindhoven (NL); Boudewijn Johannes Catharinus Jacobs, Heerlen (NL); Georg Greuel, Roetgen (DE); Margaretha Maria De Kok Van Breemen, Eindhoven (NL); Peter Van De Weijer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/122,796

(22) Filed: Apr. 12, 2002

(65) Prior Publication Data
US 2002/0179900 A1 Dec. 5, 2002

(30) Foreign Application Priority Data
Apr. 17, 2001 (EP) .............................. 01201391

(51) Int. Cl.⁷ ............................................. H01L 51/00
(52) U.S. Cl. ..................................................... 257/40
(58) Field of Search .............................. 257/40; 438/82

(56) References Cited

U.S. PATENT DOCUMENTS

| 5,726,457 | A | * | 3/1998 | Nakano et al. .............. 257/103 |
| 6,014,119 | A | | 1/2000 | Staring et al. ................ 345/82 |
| 6,331,356 | B1 | * | 12/2001 | Angelopoulos et al. ..... 257/192 |
| 6,372,154 | B1 | * | 4/2002 | Li ........................... 106/31.15 |

FOREIGN PATENT DOCUMENTS

| WO | WO9608047 | 3/1996 | .......... H01L/51/10 |
| WO | WO9827135 | 6/1998 | .......... C08G/61/00 |

OTHER PUBLICATIONS

P.W.M. Blom, H.F.M. Schoo and M. Matters; "Electrical characterization of electroluminescent polymer/nanoparticle composite devices" Appl. Phys. Lett. 73, 1998, 3914–3916.

* cited by examiner

Primary Examiner—Steven Leke
Assistant Examiner—Samuel Gebremariam

(57) ABSTRACT

The invention pertains to an organic light emitting diode (LED) comprising a transparent electrode, superposed by a layer of a conductive transparent polymer (CTP), superposed by a layer of a light emitting polymer, oligomer, or low molecular weight compound superposed by a metal cathode, characterized in that the CTP layer has a sulfate ion content of less than 7,500 ppm, and a metal ion content of more than 0.04 mmoles/g.

7 Claims, 3 Drawing Sheets

LED COMPRISING A CONDUCTIVE TRANSPARENT POLYMER LAYER WITH LOW SULFATE AND HIGH METAL ION CONTENT

FIELD TECHNOLOGY

The invention pertains to an organic light emitting diode (LED) comprising a transparent electrode, superposed by a layer of a conductive transparent polymer (CTP), superposed by a layer of a light emitting polymer, oligomer, or low molecular weight compound, superposed by a metal cathode, wherein the CTP layer has a low sulfate and high metal ion content.

BACKGROUND AND SUMMARY

LEDs comprising a conductive transparent polymer are known in the art to increase the lifetime of polymer LEDs essentially. LEDs with CTP layers have been described, for instance, in patent application WO 96/08047. Various polymeric materials have been described as suitable for use in LEDs as materials that on the one hand provide areas of electric insulation, and at the other hand provide electro-conductive areas that serve as real hole-injection anodes. Such polymers that, depending on the location, can be in the conductive and non-conductive state, have been found in the classes of polythiophenes, polyamines, polypyrroles, polyanilines, and polyacetylenes, which polymers may be substituted with alkyl and alkoxy groups, halogens, and the like. The thickness of these CTP layers is reported to be between 50 and 500 nm. Thin layers are preferred to prevent substantial absorption of the visible light, which decreases the performance of the LED. However, in practice these layers must be relatively thick to prevent leakage currents, short-circuit, and pinholes, and to improve the device lifetime.

The major disadvantage of these CTP layers is the complicated and expensive method of making layers with conductive and non-conductive areas, e.g. for use in a matrix or segmented organic LED displays. It would be a substantial advantage to make layers that have the same conductivity over the whole layer. Pixels that are electrically connected through the CTP layer suffer from an inhomogeneous decay of emitted light within one pixel under multiplexed driving, the so called anode shrinkage. Examples of multiplexed driving can be found in U.S. Pat. No. 6,014,119. Typically, anode shrinkage is first visible at the sides of the display and propagates row after row, or column after column inside the matrix display. In general anode shrinkage can appear between any two pixels or segments of a display. Moreover, generally layers of these CTP polymers influence the lifetime of the device due to compounds included in the dispersion, solution, or suspension. It is an object of the present invention to improve the pixel degradation due to the shrinkage and to improve the lifetime of the device. Also by applying ink jetting for the deposition of the CTP layer, it is possible that a connected CTP layer covering more than one pixel is easier and cheaper to realize than preparing a substrate architecture with separation walls around one pixel that prevents the CTP dispersion, suspension, or solution, dispensed to one pixel, to cover other pixels also. Such pixels, which are electrically connected via the CTP layer suffer from shrinkage under multipled driving.

It has now been found that when the CTP layer has a sulfate ion ($SO_4^{2-}$) content less than 7,500 ppm, and a metal ion content more than 0.04 mmoles/g, the lifetime and the anode shrinkage of the LEDs is considerably improved. The present invention therefore pertains to an organic light emitting diode (LED) comprising a transparent electrode, which preferably is a layer of indium oxide or indium-tin oxide (ITO), superposed by a layer of a conductive transparent polymer (CTP), superposed by a layer of a light emitting polymer, oligomer, or low molecular weight compound, superposed by a metal cathode, characterized in that the CTP layer has a sulfate ion content of less than 7,500 ppm, and a metal ion content of more than 0.04 mmoles/g.

The conductive transparent polymer can be made to a layer by any suitable method, and in general is deposited by a spin coating process from a solution, dispersion, or suspension, or by an ink jet process. For application in an organic LED display, the dried film of the conductive transparent polymer preferably satisfies one or more of the following properties to achieve a long lifetime and a minimum anode shrinkage, as well as a large efficiency:

The conductive transparent polymer is selected from of the class of polythiophenes, polypyrroles, polyanilines, polyamines, and polyacetylenes.

The salt or polyelectrolyte serving as a counter ion is selected from a sulfonic acid, such as polystyrenesulfonic acid and para-toluenesulfonic acid.

The sulfate concentration in the dried film is less than 1,250 ppm.

The metal ion concentration in the dried film is more than 0.5 mmoles/g to avoid anode shrinkage in a matrix or segmented display.

The metal ion is preferably an alkali or earth alkali metal ion. With more preference the metal ion is substantially an ion of K, Rb, Cs, Mg, Ba, and/or Ca.

The preferred requirement that the metal ions are substantially only K, Rb, Cs, Mg, Ba, and/or Ca is of particular importance when the CTP layer is used on an active matrix substrate to realize a long lifetime of the device and to avoid anode shrinkage. The metal ion concentration has then to be high, but the Li and Na ion concentration should be as low as possible, preferably less than $10^{10}$ ions/cm$^2$, to avoid MOS instability effects and to optimize the gate dielectrics. The metal ions can be added in the form of their oxides, hydroxides, or salts. Suitable salts are, for instance, carbonates, nitrates, halides (fluorides, chlorides, bromides, and iodides), organic salts, and mixtures thereof.

The sulfate content in the dried layer must be less than 7,500 ppm, which is obtained when the sulfate content is less than 300 ppm in a 4 wt. % solid CTP dispersion. A sulfate content in the dried layer of 1,250 ppm corresponds to a content of 50 ppm in a 4 wt. % dispersion that is used for making the CTP layer.

The metal ion content in the dried layer must be more than 0.04 mmoles/g, which is obtained when the metal ion content is more than 1.6 μmol/g in a 4 wt. % solid CTP dispersion that is used for making the CTP layer. An metal ion content in the dried layer of 0.5 mmoles/g corresponds to a content of 0.02 mmoles/g in a 4 wt. % dispersion.

The polymers that are suitable for the CTP layer are known in the art. Particularly, reference is made to patent application WO 96/08047, which discloses various materials and methods of preparation thereof, and which contents are incorporated by reference. Useful polymers are polythiophenes, polypyrroles, polyanilines, polyamines, and polyacetylenes. Particularly useful are poly-3,4-ethylene dioxythiophene, polyaniline (PANI), and polyurethanes such as ConQuest (ex. DSM, The Netherlands). The polymer may be mixed with monomers, oligomers, or other polymers. A preferred material for use in the CTP layer is the mixture of poly-3,4-ethylene dioxythiophene and polystyrene sulfonic acid (PEDOT).

The active layer is situated between two electrode layers of electroconductive materials. At least one of said electrode layers must be transparent or translucent to the emitted light in the active layer. One of the electrode layers serves as the (positive) electrode for injecting holes into the active layer. The material of this electrode layer has a high work function and is generally formed by a layer of indium oxide or indium-tin oxide (ITO). In addition, such layers are transparent to the emitted light in the active layer. Particularly ITO is suitable because of its satisfactory electrical conductivity and high transparency. The other electrode layer serves as the (negative) electrode for injecting electrons into the active layer. The material for this layer has a lower work function and is generally formed from a layer of, for example, indium, calcium, barium, or magnesium.

The electrode layer of ITO is provided by vacuum evaporation, sputtering, or a CVD process. This electrode layer and often also the negative electrode layer, for example, of calcium, are structured in accordance with a pattern by means of a customary photolithographic process or by partly covering it with a mask during the vacuum deposition process which corresponds to the desired pattern for a display. In a typical example of a display, the electrodes of the first and second electrode layers have line structures which intersect each other at right angles and hence form a matrix of separately drivable rectangular LEDs. The rectangular LEDs constitute the pixels or picture elements of the display. If the electrodes of the first and second electrode layers are connected to an electrical source, light-emitting pixels are formed at the intersection of the electrodes. In this way a display can be formed in a simple manner. The pixel structure is not limited to a particular shape. Basically all pixel shapes are possible leading to a segmented display, e.g. for showing icons or simple figures.

The light emitting polymers, oligomers, or low molecular weight compounds may be any electroluminescent material, such as polyfluorene copolymers such as disclosed in WO 97/33323, polyspiro copolymers such as disclosed in DE 19615128, poly(3-alkylthiophene), and poly(p-phenylene vinylene) (PPV) such as disclosed in WO 98/27136. Preferably, soluble conjugated polymers and oligomers are used because they can be easily applied, for example in a spin-coating process or by ink jetting. Preferred examples of soluble conjugated PPV derivatives are poly(dialkyl-p-phenylene vinylene) and poly(dialkoxy-p-phenylene vinylene). The light emitting material may also be a doped low molecular material, such as 8-hydroxyquinolin-aluminum doped with a dye, such as quinacridone, deposited in a vacuum process.

Dependent upon the preparation of the conjugated polymer, said polymer may comprise 5 to 10% non-conjugated units. It has been found that such non-conjugated units increase the electroluminescence efficiency, which is defined by the number of photons per injected electron in the active layer.

The above-mentioned conjugated PPV derivatives can be dissolved in the customary organic solvents, for example halogenated hydrocarbons such as chloroform, and aromatic hydrocarbons such as toluene. Acetone and tetrahydrofurane can also be used as solvents.

The degree of polymerization of the conjugated polymer ranges between 10 and 100,000.

The layer thickness of the light emitting layer of the conjugated polymer often ranges between 10 and 250 nm, in particular between 50 and 130 nm.

The LED structure can be provided on a substrate which is made, for example, from glass, quartz glass, ceramic, or synthetic resin material. Transistors or other electronic means may be present between the substrate and the transparent electrode forming a so called active matrix substrate. Preferably, use is made of a translucent or transparent substrate. If a flexible electroluminescent device is desired, use is made of a transparent foil of a synthetic resin. Suitable transparent and flexible synthetic resins are, for example, polyimide, polyethylene terephthalate, polycarbonate, polyethene, and polyvinyl chloride.

These and other aspects of the invention will be apparent from and elucidated with reference to the embodiments described hereinafter.

BRIEF DESCRIPTION OF THE DRAWING FIGURES

Figure 4:
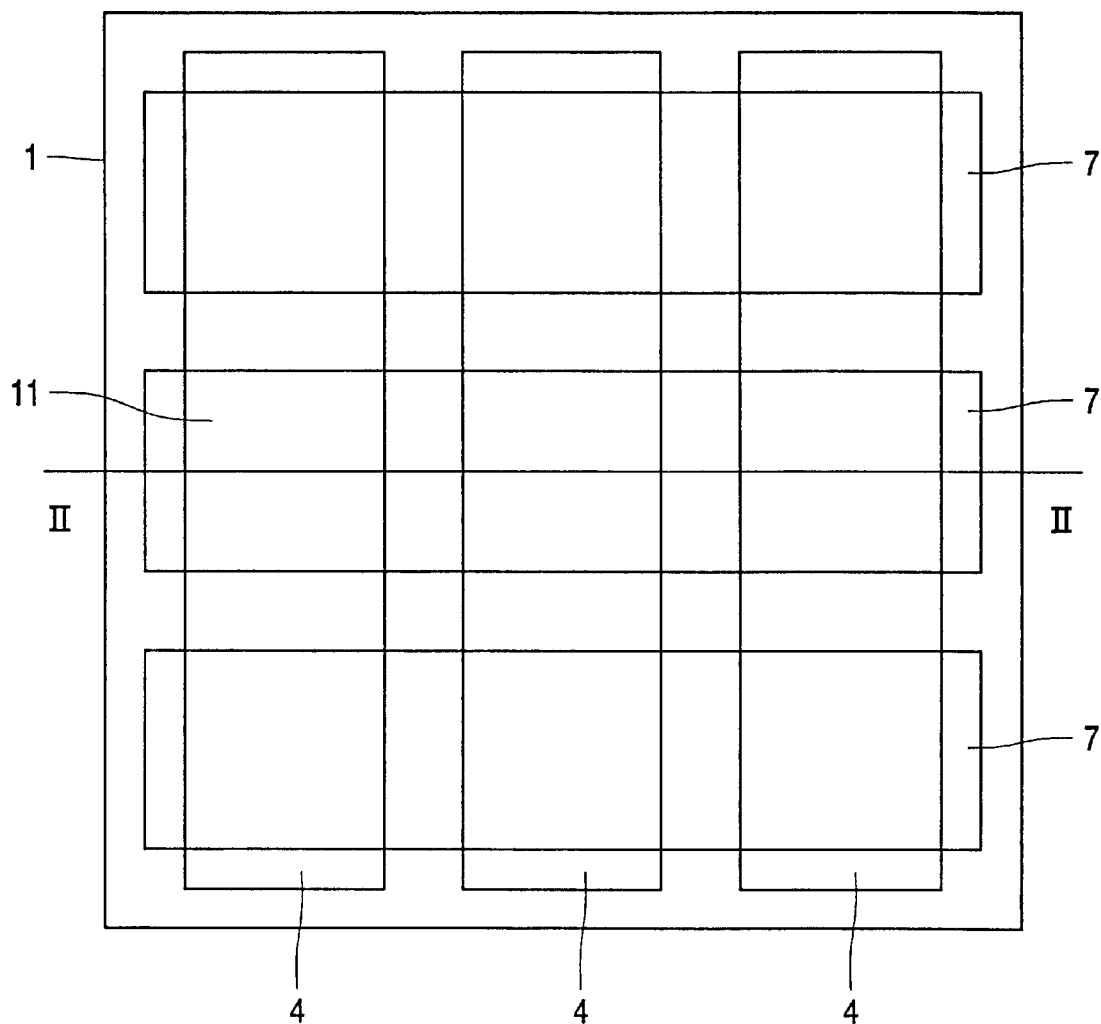
Figure 5:
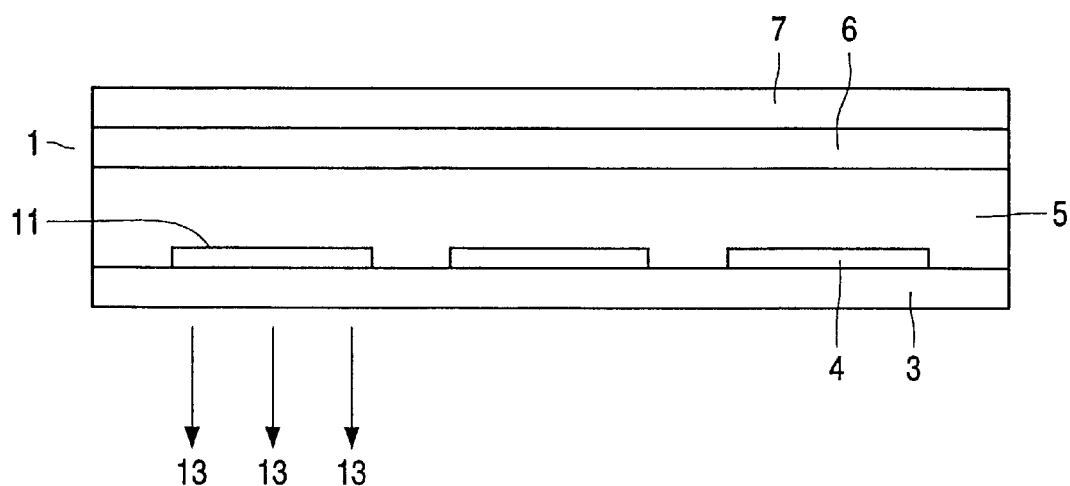

FIG. 4 schematically shows a plan view of an electroluminescent device in the form of a display, FIG. 5 schematically shows a cross-sectional view taken on the line II—II in FIG. 4.

DETAILED DESCRIPTION

A substrate 3 is provided with structured ITO (or another transparent electrode) 4 via a shadow mask in a sputter process in vacuum. The CTP layer 5 is deposited by spin coating as a closed layer over the structured ITO. The organic light emitting material 6 is spin coated as a closed layer over the CTP layer. Electrodes 7 are vacuum evaporated via a mask on the light emitting layer 6.

Each crossing of an electrode 4 with an electrode 7 defines a pixel. By the way of example, one of the electrodes 7 (the middle electrode of FIG. 4) and one of the electrodes 4 (the leftmost electrode of FIG. 4) are connected to an electrical source, the electrodes 7 being earthed. The organic light emitting layer 6, at the location of pixel 11, emits light, which leaves the LED via the substrate 3 (indicated by arrows 13, FIG. 5).

The organic light emitting device 1 is encapsulated so as to avoid contact with oxygen and water.

The organic light emitting device 1 further includes an electrical source capable of providing a current sufficient to obtain an emission of light of brightness 200 cd/m$^2$ or more.

The pixels in device 1 form a matrix or segmented display, where pixel for pixel is driven in a multiplexed driving scheme. In a multiplexed driving scheme, as described in patent U.S. Pat. No. 6,014,119 electrical pulses are applied to each pixel for a certain time resulting in a time averaged brightness of, for example, 200 cd/m$^2$. It is also possible to connect all electrodes 4 with each other, as well as electrodes 7 with each other, and to apply a constant current. In this case all pixels have the same current density at the same time, called here DC-driving.

The organic light emitting device 1 can be subjected to a DC-driving service life test wherein the positive pole of the current source is connected to all anodes 4 and the negative electrode to all cathodes 7, and the device is driven at constant current and at an initial brightness of 200 Cd/m², while maintaining an ambient temperature of 80° C. The service life is defined as the time wherein the brightness drops to half its initial value. A DC-driving lifetime test results in a homogeneous decay of electroluminescence of all pixels. A typical result is shown in FIG. 1 as function of the sulfate concentration.

Figure 1:
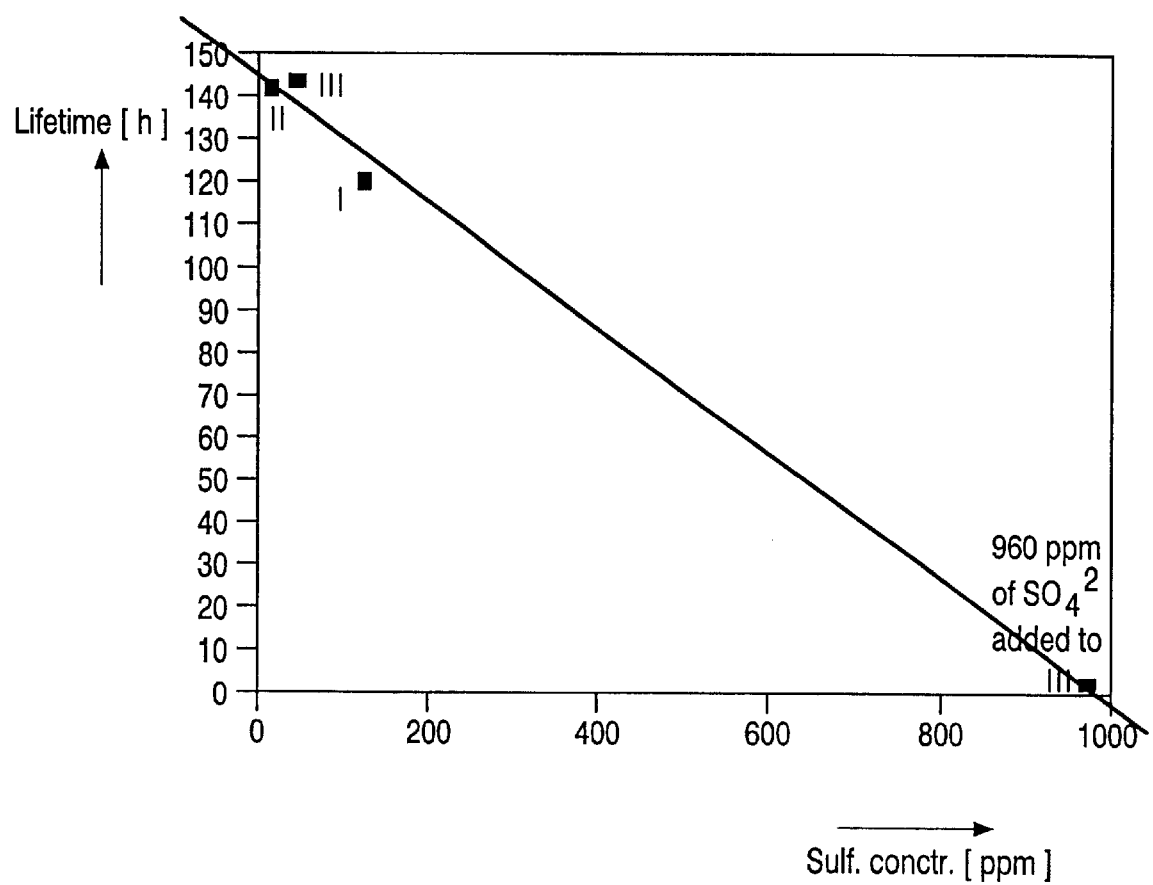
FIG. 1 illustrates polyLED service life as a function of sulfate concentration in dispersion of CTP layer poly-3,4-ethylene dioxythiophene and polystyrene sulfonic acid.

FIG. 1. Correlation between the sulfate concentration in the dispersion of the CTP layer PEDOT and the lifetime of a polyLED at 80° C. under DC-driving with an initial brightness of 200 cd/m².

I is PEDOT after synthesis, containing 120 ppm of $SO_4^{2-}$ ions in the dispersion, and having a ratio poly-3,4-ethylene dioxythiophene: PSS=1:20.

II is ion-exchanged I resulting in less than 10 ppm $SO_4^{2-}$ ions in the dispersion (the detection limit of the used method).

III is a standard cleaned batch with 42 ppm $SO_4^{2-}$ ions in the dispersion (ratio poly-3,4-ethylene dioxythiophene: PSS=1:6).

When 960 ppm of $SO_4^{2-}$ ions were added to III, the lifetime decreased to 4 h.

From FIG. 1 it can be concluded that the $SO_4^{2-}$ ion concentration should be less than 300 ppm, preferably less than 50 ppm in a 4 wt. % dispersion, particularly when the LED display is used in the telecom market. A telecom matrix display should preferably live for at least 125 h at 80° C.

In a service life test under a multiplexed driving scheme electrical pulses are applied to each pixel for a certain period of time resulting in an initial brightness of the device of 200 cd/m2.

Figure 2:
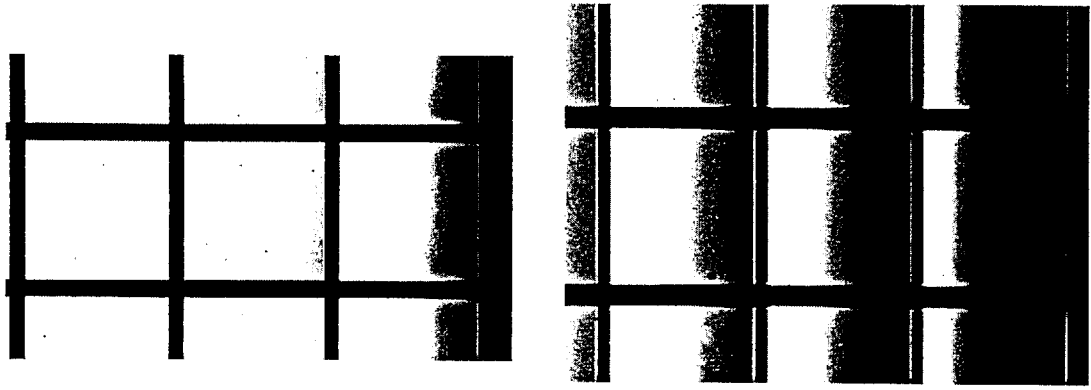
FIG. 2 illustrates results of anode shrinkage under multiplexed driving.

The sample shows during the service life test anode shrinkage under multiplexed driving, an inhomogeneous degradation of electroluminescence in the rows of pixels as shown in FIG. 2.

FIG. 2 shows photographs of pixels exhibiting anode shrinkage after service life testing under multiplexed driving. Left: entry 13 of Table 1 (1.0 mmole/g of Na). Right: entry 3 of Table 1 (0.086 mmoles/g of Na).

In a display a degradation phenomenon occurs under multiplexed driving, which is called anode shrinkage. This phenomenon leads to pixel degradation typically from the sides extending to the center during the lifetime test as shown in FIG. 2. In general anode shrinkage can appear between any two pixels or segments of a display.

The inhomogeneous degradation of the electroluminescence is not related to the light emitting polymer but to the CTP layer, as is shown in example 3.

The effect of metal ions on anode shrinkage was also determined. For example, sodium was added as sodium hydroxide (NaOH) to a PEDOT dispersion.

A correlation between the sodium concentration and the amount of anode shrinkage was found, see FIG. 2 and Table 1.

TABLE 1

| | | Anode shrinkage | | |
|---|---|---|---|---|
| Entry | PEDOT ratio# | Na [mmoles/g] | $SO_4^{2-}$ [ppm] | Shrinkage performance |
| 1 | 1/12 | 0.010 | 350 | — |
| 2 | 1/20 | 0.027 | 875 | — |
| 3 | 1/12 | 0.086 | 1,300 | * |
| 4 | 1/20 | 0.131 | 1,700 | * |
| 5 | 1/12 | 0.161 | 500 | * |
| 6 | 1/12 | 0.165 | 675 | * |
| 7 | 1/20 | 0.253 | <250### | * |
| 8 | 1/20 | 0.286 | 275 | ** |
| 9 | 1/20 | 0.288 | <250 | ** |
| 10 | 1/20 | 0.398 | <250 | ** |
| 11 | 1/12 | 0.475 | <250 | ** |
| 12 | 1/12 | 0.543 | <250 | ** |
| 13 | 1/6## | 1.000 | 1,050 | *** | poly-3,4-ethylene dioxythiophene:PSS ratio
standard PEDOT (ratio 1/6)
detection limit Table 1. Correlation between the anode shrinkage expressed qualitatively with a star (–=useless, *=poor; =medium; *=best material) and the sodium concentration of the dried PEDOT layer. An improvement is visible around 0.08 mmoles/g. A sodium concentration more than 0.25 mmoles/g is preferred.

The material of entry 2 showed after 24 h at 80° C. a loss of three rows of pixels. A display wherein 0.022 mmoles/g of sodium in the form of sodium chloride were added to the dispersion of the material of entry 2 did not show signs of anode shrinkage after 24 h at 80° C. A similar effect was found for other metal ions. A display wherein 0.088 mmoles/g of sodium in the form of sodium chloride were added to the materials of entry 2 did not show anode shrinkage during the service life test.

This demonstrates that it is beneficial to add extra sodium ions to the CTP layer. However, sodium ions (and also lithium ions) are detrimental for the gate dielectrics of transistors. Thus when the present CTP layers are used on active matrix substrates, it is better not to use lithium and sodium ions. Larger ions or di-, tri-, and tetravalent ions were found to be beneficial for preventing anode shrinkage without affecting the gate dielectrics. When alkali metal ions are used, it is therefore preferred to use K, Rb, and/or Cs. Li and Na ions would limit the lifetime of the device due to their detrimental effect on the gate dielectric.

In a preferred embodiment only the transparent electrode (preferably ITO) and the cathode are structured. PEDOT and light emitting polymer or oligomer are spin coated over the structured transparent electrode (ITO) and remain as a closed layer in the device, connected over any of the different pixels, because structuring the polymers is not possible or difficult. The used architecture is, due to its easy preparation, the state of the art in polymeric LEDs.

With this "connected PEDOT layer" device architecture anode shrinkage is a problem that occurs because any of the pixels are connected through the closed PEDOT film. Note that PEDOT can be replaced by another polymer. Thus were PEDOT is described in this description, any other of the suitable polymers can also be used.

The invention is illustrated by the following examples.

EXAMPLE 1

An organic LED was constructed in the following manner, referring to FIGS. 4 and 5:

a) A substrate 3 of soda lime glass was coated with indium tin oxide in a sputter process via shadow mask (ITO, 170 nm thick, executed by Balzers) resulting in the structured layer 4 in FIG. 4. Before the deposition of the CTP layer the substrate was washed with water under ultrasonic treatment, dried in a centrifuge, and UV/ozone cleaned for 15 min.

b) In turn the structured ITO layer was covered by a 200 nm layer 5 of CTP material PEDOT (poly-3,4-ethylenedioxythiophene and polystyrenesulfonic acid in the ratio 1:20) (ex. Bayer, Baytron P, PSS was added to the ratio 1:20), provided by means of a spin coating process. The layer was dried for 5 min at 170° C. in air on a hotplate. The latter two layers (ITO and PEDOT) together constituted the hole-injecting electrode. The dried PEDOT layer contained 0.027 mmoles/g of Na and 875 ppm of sulfate (entry 2 of Table 1).

The electroluminescent layer 6 was also provided by means of spin coating and was made of a material consisting of an aryl-substituted poly-p-arylenevinylene of the repeating unit of formula I (see below). The polymer of formula I is known from WO 98/27136 and from P. W. M. Blom, H. F. M. Schoo and M. Matters, Appl. Phys. Lett. 73, 1998, 3914–3916, p. 3916, inlet in FIG. 2, and photo-and electroluminescences red to orange light.

The light emitting polymer has the formula I:

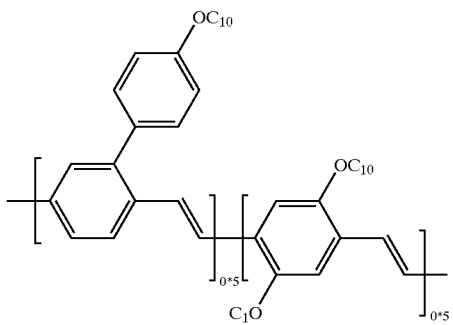

d) The electroluminescent layer 6 was covered, in succession, with a Ba and an Al layer of 10 and 100 nm thickness, respectively, which together form the electron-injecting electrode, each layer being applied by means of deposition of metal vapor in vacuo via a shadow mask, resulting in the pixelated device shown in FIGS. 4 and 5.

The organic light emitting device 1 was subjected to a DC driven service life test in which the positive pole of the current source was connected to all anodes 4 and the negative electrode to all cathodes 7 of the device, and the device was driven at a constant current and at an initial brightness of 200 Cd/m$^2$, while maintaining an ambient temperature of 80° C. The service life, defined as the time wherein the brightness drops to half its initial value, thus determined was about 140 h with a homogeneous decrease of the emitted light intensity in all pixels.

Figure 3:
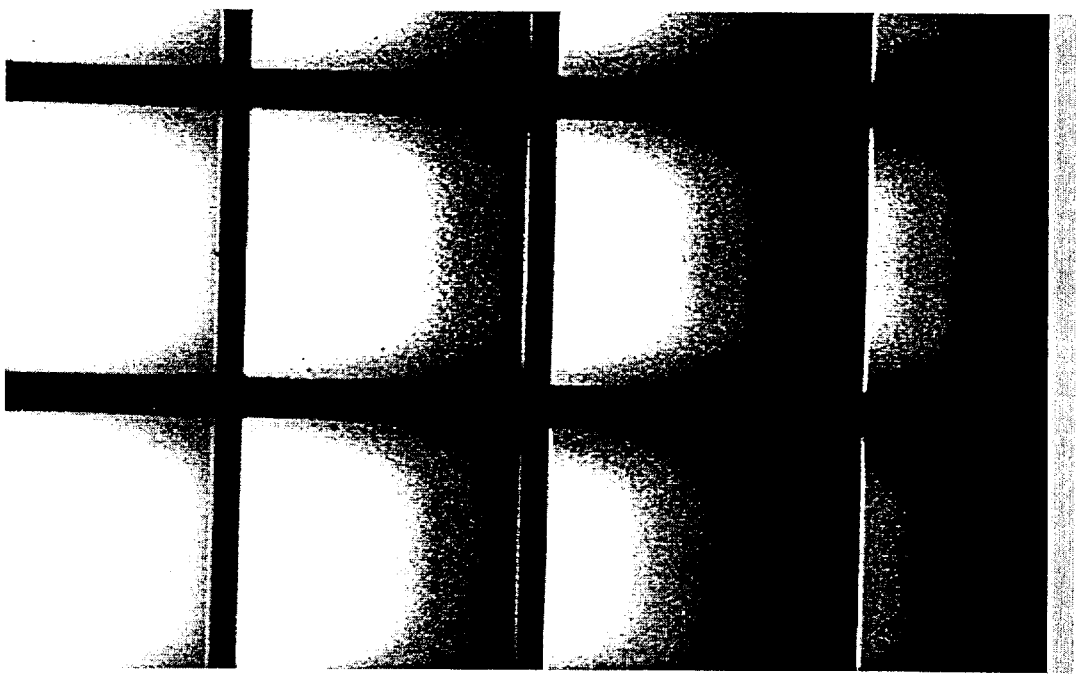
FIG. 3 is a further illustration of results of anode shrinkage under multiplexed driving.

In a lifetime test under a multiplexed driving scheme where electrical pulses were applied to each pixel for a certain period of time, resulting in an initial brightness of the device of 200 cd/m$^2$, a service lifetime of about 140 h was achieved. The sample showed anode shrinkage under multiplexed driving. After 96 h at 80° C. an inhomogeneous electro-luminescence in four rows of pixels was obtained as shown in FIG. 3. The inhomogeneous degradation of the electrolumninescence was not related to the light emitting polymer but to the CTP layer (see Example 3).

FIG. 3. Anode shrinkage of a LED after 96 h service lifetime test at 80° C. under multiplexed driving.

EXAMPLE 2

Example 1 was repeated, except that different concentrations of sulfate ions were added to the PEDOT dispersion. To demonstrate that $SO_4^{2-}$ ions are detrimental to lifetime and efficiency of a polyLED, sulfuric acid ($H_2SO_4$) was added to PEDOT:

A 100 ml of the PEDOT dispersion of Example 1 has a 4 wt. % solid content, of which about 95 wt. % is PSS. This corresponds to 0.021 mole monomer of PSS in 100 ml of PEDOT.

Respectively, 0.001 mole (=0.096 g=960 ppm $SO_4^{2-}$ per 100 ml) and 0.005 moles (=0.48 g=4800 ppm $SO_4^{2-}$ per 100 ml) of $H_2SO_4$ were added to the PEDOT dispersion. The efficiency and lifetime of the devices decreased dramatically as shown in Table 2.

Metal ion sulfates, such as $K_2SO_4$, added to the PEDOT dispersion had the same detrimental effect as $H_2SO_4$.

| | $SO_4^{2-}$[ppm] in the 4 wt. % dispersion | $SO_4^{2-}$[ppm] in the dried film | Efficiency cd/A at 4 V at room temperature | Lifetime [h] at 80° C. |
|---|---|---|---|---|
| PEDOT entry 2 of Table 1 | 35 | 875 | 2.1 | 140 |
| plus 0.096 g of $H_2SO_4$ | 960 | 24,000 | 0.6 | 4 |
| plus 0.48 g of $H_2SO_4$ | 4,800 | 120,000 | 0 | 0 |

Table 2. Efficiency at room temperature and lifetime under DC driving of the light emitting polymer at 80° C., 200 cd/m$^2$ with standard and modified PEDOT. All cathodes and all anodes were connected and a constant current was applied resulting in 200 cd/m$^2$ initial brightness at room temperature.

EXAMPLE 3

Example 1 was repeated, except that NaCl was added to the PEDOT dispersion to prevent anode shrinkage as presented in FIG. 4, to give 0.022 mmoles/g of sodium in the dispersion. The material as used in Example 1 showed an inhomogeneous electroluminescence in four rows of pixels already after 24 h at 80° C. under multiplexed driving, whereas the matrix display in addition containing 0.022 mmoles/g of sodium did not give anode shrinkage after 24 h.

EXAMPLE 4

Example 1 was repeated, except that NaCl was added to the PEDOT dispersion to give 0.088 mmoles/g of sodium in the dispersion. After 96 h service lifetime test under a multiplexed driving scheme, the matrix display showed no anode shrinkage.

The examples hereinabove illustrate that the amount of sodium in a charge transport polymer (CTP) layer for use in an organic LED may have a significant effect on the extent of anode shrinkage observed in accelerated service life tests in which the LED is driven in a multiplexed driving scheme. The light emitting polymer used is these examples is a PPV.

Similar results are obtained for polyfluorenes as light emitting polymer. In a specific example of a LED comprising a red emitting polyfluorene and a CTP layer comprising about 0.25 mmol/g Na, no anode shrinkage is observed in a lifetime test performed at 80° C. for 600 h. By comparison, if the same CTP layer is used but without sodium severe anode shrinkage is observed. Identical results are obtained if the red-emitting polyfluorene is replaced with a green-emitting polyfluorene: no shrinkage in the sodium-containing CTP layer severe shrinkage if the CTP layer is sodium free.

The lifetime of a LED comprising a PPV as the light emitting polymer is somewhat but not severely affected by the amount of sodium present in the CTP layer. As a typical example, if the lifetime of a PPV LED having a PEDOT CTP layer comprising 0.003 mmol/g Na is 77 h, the lifetime of a LED which is identical in all aspects except that the CTP layer comprises 1 mmol/g Na increases to 111 h.

However, polyfluorenes show a more complex effect of amount of sodium on lifetime as illustrated in the table below.

TABLE 2

| PEDOT layer no. | Na (mmol/g) | L (t = 0) in Cd/m$^2$ | lifetime (h) |
|---|---|---|---|
| 1 | 2.2 | 382 | 24 |
| 2 | 0.34 | 545 | 107 |
| 3 | 0.15 | 599 | 166 |
| 4 | 0.003 | 656 | 30 |

In the table 2 the second column indicates the concentration of Na in the CTP layer, column 3 the efficiency of the LED in terms of the luminance L at the beginning of the service life test and the last column indicates the lifetime of the LED when stressed the service life test being a DC service life test at a constant current density of 6.25 mA/cm$^2$. A similar result is expected under multiplexed conditions. Surprisingly, contrary to common belief, the table 2 shows that although the efficiency at the beginning of the service life test steadily increases as the amount of sodium is lowered, the lifetime does not follow the same trend and shows an optimum at about 0.15 mmol/g Na.

What is claimed is:

1. An organic light emitting diode (LED) comprising a transparent electrode layer, superposed by a layer of a conductive transparent polymer (CTP), superposed by a layer of a light emitting polymer, oligomer, or low molecular weight compound superposed by a metal cathode, characterized in that the CTP layer has a sulfate ion content of less than 7,500 ppm, and a metal ion content of more than 0.04 mmoles/g.

2. The LED of claim 1 wherein the CTP comprises a polymer selected from polythiophene, polypyrrole, polyamine, polyaniline, and polyacetylene.

3. The LED of claim 2 wherein the CTP is a mixture of poly-3,4-ethylene dioxythiophene and polystyrenesulfonic acid (PEDOT).

4. The LED of claim 1 having a CTP layer wherein the sulfate ion content is less than 1,250 ppm.

5. The LED of claim 1 having a CTP layer wherein the metal ion content is more than 0.5 mmoles/g.

6. The LED of claim 1 having a CTP layer wherein the metal ion is an alkali or earth alkali metal, preferably K, Rb, Cs, Mg, Ba, and/or Ca.

7. The LED of claim 1 wherein the transparent electrode layer is a layer of indium oxide or indium-tin oxide (ITO).

* * * * *